(12) United States Patent
Uprety et al.

(10) Patent No.: US 8,956,730 B2
(45) Date of Patent: Feb. 17, 2015

(54) CONDUCTIVE MULTILAYER STACK, COATED SUBSTRATES INCLUDING THE SAME, AND METHODS OF MAKING THE SAME

(71) Applicant: PPG Industries Ohio, Inc., Cleveland, OH (US)

(72) Inventors: Krishna K. Uprety, Valencia, CA (US); Alexander Bimanand, Burbank, CA (US); Khushroo H. Lakdawala, Santa Clarita, CA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 13/631,773

(22) Filed: Sep. 28, 2012

(65) Prior Publication Data

US 2014/0093696 A1 Apr. 3, 2014

(51) Int. Cl.
*C09D 175/06* (2006.01)
*B64D 45/02* (2006.01)

(52) U.S. Cl.
USPC ..... 428/425.9; 428/172; 428/336; 428/411.1; 428/412; 428/423.1; 428/480; 428/522; 428/413; 428/469; 428/472; 428/447; 438/763

(58) Field of Classification Search
CPC .... B64D 7/00; B64C 1/1476; C23C 14/0036; C23C 14/083; C23C 14/205; C23C 28/00; C23C 28/322; C23C 28/3455; C23C 28/42; G02B 1/116
USPC .............. 428/412, 423.1, 480, 522, 413, 469, 428/447, 425.9; 438/763
See application file for complete search history.

(56) References Cited

U.S. PATENT DOCUMENTS

| 3,017,386 A | 1/1962 | Brown, Jr. et al. |
| 3,180,781 A | 4/1965 | Ryan et al. |
| 4,234,664 A | 11/1980 | Hendy |

(Continued)

FOREIGN PATENT DOCUMENTS

| EP | 2128528 A2 | 12/2009 |
| WO | WO 00/55389 | 9/2000 |

(Continued)

OTHER PUBLICATIONS

Zhao Bao-xing, et al. "Microstructure and optical properties of TiO2 thin films deposited at different oxygen flow rates", Dec. 14, 2009, Transactions of Nonferrous Metals Society of China, 20, pp. 1429-1433.*

(Continued)

*Primary Examiner* — Maria Veronica Ewald
*Assistant Examiner* — Brian Handville
(74) *Attorney, Agent, or Firm* — Christie, Parker & Hale, LLP

(57) ABSTRACT

An electrically conductive multilayer stack including a first metal oxide layer including titanium oxide, a metal layer on the first metal oxide layer, and a second metal oxide layer including titanium oxide on the metal layer, at least one of the first metal oxide layer and the second metal oxide layer including a first region, a second region on the first region, and a third region on the second region, the first region and the third region each having a higher oxygen concentration than that of the second region is disclosed. Methods of manufacturing an electrically conductive multilayer stack are also disclosed.

23 Claims, 7 Drawing Sheets

(56) References Cited

U.S. PATENT DOCUMENTS

| | | | |
|---|---|---|---|
| 4,336,119 A | 6/1982 | Gillery | |
| 4,465,736 A | 8/1984 | Nishihara et al. | |
| 4,642,263 A | 2/1987 | Culbertson | |
| 5,084,132 A | 1/1992 | Smith | |
| 5,213,828 A | 5/1993 | Winter et al. | |
| 5,378,535 A | 1/1995 | Moncur et al. | |
| 5,780,160 A | 7/1998 | Allemand et al. | |
| 5,859,722 A | 1/1999 | Suga et al. | |
| 5,939,188 A | 8/1999 | Moncur et al. | |
| 6,213,602 B1 | 4/2001 | Smarto | |
| 6,417,292 B1 | 7/2002 | Moriarity et al. | |
| 6,426,125 B1 | 7/2002 | Yang et al. | |
| 6,690,564 B1 | 2/2004 | Haruta et al. | |
| 6,737,121 B2 | 5/2004 | Yang et al. | |
| 6,933,053 B2 * | 8/2005 | Alger | 428/472 |
| 7,093,307 B1 | 8/2006 | Smith | |
| 7,626,749 B2 | 12/2009 | Baur et al. | |
| 7,636,188 B2 | 12/2009 | Baur et al. | |
| 7,859,738 B2 | 12/2010 | Baur et al. | |
| 2002/0110695 A1 | 8/2002 | Yang et al. | |
| 2003/0054172 A1 | 3/2003 | Savu et al. | |
| 2006/0134501 A1 | 6/2006 | Lee et al. | |
| 2007/0002421 A1 | 1/2007 | Rukavina et al. | |
| 2007/0029299 A1 | 2/2007 | Prone et al. | |
| 2007/0224340 A1 | 9/2007 | Hatta et al. | |
| 2007/0249088 A1 | 10/2007 | Ohmori et al. | |
| 2008/0073622 A1 | 3/2008 | Housel | |
| 2008/0176973 A1 | 7/2008 | Qiu et al. | |
| 2008/0212189 A1 | 9/2008 | Baur et al. | |
| 2009/0040306 A1 | 2/2009 | Foote et al. | |
| 2009/0074973 A1 | 3/2009 | Graham et al. | |
| 2009/0080055 A1 | 3/2009 | Baur et al. | |
| 2009/0289235 A1 | 11/2009 | Kniajanski et al. | |
| 2009/0301461 A1 | 12/2009 | Taplan et al. | |
| 2010/0025533 A1 | 2/2010 | Bimanand et al. | |
| 2010/0028684 A1 | 2/2010 | Mariscal et al. | |
| 2010/0066519 A1 | 3/2010 | Baur et al. | |
| 2010/0156842 A1 | 6/2010 | Cherif | |

FOREIGN PATENT DOCUMENTS

| | | |
|---|---|---|
| WO | WO 2004/106582 A2 | 12/2004 |
| WO | WO 2006/124682 A2 | 11/2006 |
| WO | WO 2007/040352 A1 | 4/2007 |

OTHER PUBLICATIONS

International Search Report and Written Opinion dated Sep. 15, 2009 for PCT application No. PCT/US 2009/52009.

International Search Report and Written Opinion dated Sep. 23, 2009 for PCT application No. PCT/US 2009/052015.

Berredjem, Y., et al., "On the improvement of the efficiency of organic photovoltaic cells by the presence of an ultra-thin metal layer at the interface organic/ITO," The European Physical Journal Applied Physics, Oct. 24, 2008, vol. 44, p. 223-228.

Cairns, Darran R., et al., "Strain-dependent electrical resistance of tin-doped indium oxide on polymer substrates," Applied Physics Letters, Mar. 13, 2000, vol. 76, No. 11, p. 1425-1427.

Fortunato, Elvira et al., "Influence of the Strain on the Electrical Resistance of Zinc Oxide Doped Thin Film Deposited on Plymer Substrates," Advanced Engineering Materials, May 1, 2002, vol. 4, No. 8, p. 610-612.

Lansaker, P.C., et al., "$TiO_2$/Au/$TiO_2$ multilayer thin films: Novel metal-based transparent conductors for electrochromic devices," Thin Solid Films, 2009, vol. 518, p. 1225-1229.

International Search Report and Written Opinion of the International Searching Authority, dated Nov. 27, 2013, issued in corresponding application No. PCT/2013/053823 (10 pages).

* cited by examiner

CONDUCTIVE MULTILAYER STACK, COATED SUBSTRATES INCLUDING THE SAME, AND METHODS OF MAKING THE SAME

FIELD

The following description relates generally to coated transparencies (e.g., coated laminates). More specifically, the following description relates to a coated transparency including an electrically conductive multilayer stack having a sheet resistance suitable for providing radar attenuation and antistatic or static-dissipative properties and methods of manufacturing the same.

BACKGROUND

Aircraft canopies, and particularly stealth aircraft canopies, preferably include a low resistance (i.e., high electrical conductivity) layer (or layers) to prevent or reduce the buildup of static charge and to provide radar attenuation. Static charge can buildup on a canopy as the result of precipitation static and/or lightning strikes, and may interfere with various functions of the aircraft. By including a low resistance layer (or layers), an aircraft canopy can drain or dissipate static electricity and thereby prevent or reduce the buildup of static charge on the canopy. The low resistance layer (or layers) may be coated with a high resistance topcoat (e.g., a polyurethane antistatic coating), so long as the static charge can be transferred through the organic topcoat into the low resistance layer (or layers).

Modern jet aircraft canopies, such as F-22 stealth fighter canopies, are typically made of polymeric materials. Such materials are desirable because of their light weight, high strength, and ease of shaping. Most polymeric materials, however, do not meet the requirements for stealth aircraft, such as low sheet resistance and the ability to withstand extreme weather conditions. As a result, coatings (e.g., organic and inorganic coatings) are employed to impart high electrical conductivity and other necessary characteristics to the canopy.

SUMMARY

Aspects of embodiments of the present invention are directed to a highly durable non-corrosive, and electrically conductive multilayer stack, which can be coated on a transparency. The electrically conductive multilayer stack includes: first and second metal oxide layers including titanium oxide, the first metal oxide layer including a first region, a second region on the first region, and a third region on the second region, the first region and the third region each having a higher oxygen concentration than that of the second region; and a metal layer between the first and second metal oxide layers. According to embodiments of the present invention, the metal oxide layers including titanium oxide have high refractive indices, high light transmission, good chemical stability and good adhesion to other layers, as compared to other metal oxide layers.

The metal layer may include gold (Au).

In some embodiments, each of the first metal oxide layer and the second metal oxide layer include the first region, the second region and the third region.

The first region may have a thickness in a range of about 0.5 to about 6 nm, for example about 2 to about 6 nm.

The second region may have a thickness in a range of about 3 to about 8 nm.

The third region may have a thickness in a range of about 0.5 to about 6 nm, for example about 2 to about 6 nm.

The ratio of the thickness of the first region to that of the second region may be in a range of about 0.0625:1 to about 1:1, for example about 0.25:1 to about 1:1.

The ratio of the thickness of the third region to that of the second region may be in a range of about 0.0625:1 to about 1:1, for example about 0.25:1 to about 1:1.

At least one of the first metal oxide layer and the second metal oxide layer may have a thickness in a range of about 4 to about 20, for example about 8 to about 15 nm.

The metal layer may have a thickness in a range of about 5 to about 20 nm.

In some embodiments of the present invention, the coated transparency is an aircraft canopy.

In some exemplary embodiments, the electrically conductive multilayer stack may be transparent.

The electrically conductive multilayer stack may have a visible light transmittance of at least about 61%.

According to some embodiments of the invention, a coated transparency includes a transparency and an electrically conductive multilayer stack on the transparency. The electrically conductive multilayer stack may be the above-described electrically conductive multilayer stack. In some embodiments, the coated transparency also includes a base layer positioned over the transparency, wherein the base layer is between the transparency and the electrically conductive multilayer stack.

The base layer may include a material selected from polyepoxides, polyacrylates, polyurethanes, polysiloxanes, and combinations thereof.

The coated transparency may also include a tie layer positioned over the transparency between the transparency and the base layer.

Aspects of embodiments of the present invention are also directed to a coated transparency that further includes a topcoat positioned over the electrically conductive multilayer stack.

In some embodiments, the topcoat includes a hydrophobic component having a fluorinated carbon backbone and a hydrophilic component having a polyether chain.

The topcoat may be a reaction product of a hydrophobic precursor having a fluorinated carbon backbone and a hydrophilic precursor having a polyether chain.

The topcoat may further include a compound including polyurethane functional groups. For example, the topcoat may be formed by mixing a mixture including compounds including one or more reactive functional groups, such as hydroxyl groups, with a mixture including compounds including one or more reactive functional groups, such as isocyanate groups, and applying the resultant mixture on the electrically conductive multilayer stack and reacting the hydroxyl groups and isocyanate groups to form polyurethane functional groups.

The topcoat may be in direct physical contact with the second metal oxide layer.

In some embodiments, the coated transparency further includes a topcoat tie layer between the topcoat and the electrically conductive multilayer stack.

The topcoat tie layer may be electrically conductive.

Aspects of embodiments of the invention are also directed to a method of manufacturing an electrically conductive multilayer stack. The method may include: forming a first metal oxide layer including titanium oxide; forming a metal layer on the first metal oxide layer; and forming a second metal oxide layer including titanium oxide on the metal layer.

Forming the first metal oxide layer or forming the second metal oxide layer includes varying a flow rate of oxygen during formation.

In some embodiments, varying the flow rate of oxygen includes flowing oxygen at a first oxygen flow rate, flowing oxygen at a second oxygen flow rate, and flowing oxygen at a third oxygen flow rate. For example, varying the flow rate of oxygen includes first flowing oxygen at the first oxygen flow rate, the flowing oxygen at the second oxygen flow rate, and then flowing oxygen at the third oxygen flow rate.

A ratio of the first oxygen flow rate to the second oxygen flow rate may be in a range of about 10:1 to about 25:1, and a ratio of the third oxygen flow rate to the second oxygen flow rate may be in a range of about 10:1 to about 25:1.

Varying the flow rate of oxygen may further include flowing a first inert gas at a first inert gas flow rate, flowing a second inert gas at a second inert gas flow rate, and then flowing a third inert gas at a third inert gas flow rate. For example, flowing inert gas may include first flowing the first inert gas at the first inert gas flow rate, then flowing the second inert gas at the second inert gas flow rate, and then flowing the third inert gas at the third inert gas flow rate. The first, second and third inert gases can be the same or different. In some embodiments, each of the first inert gas, second inert gas and the third inert gas are all the same (e.g., Ar).

A ratio of the first oxygen flow rate to the first inert gas flow rate may be in a range of about 0.8:2.2 to about 1:1.8, a ratio of the second oxygen flow rate to the second inert gas flow rate may be in a range of about 1:29 to about 2:25, and a ratio of the third oxygen flow rate to the third inert gas flow rate may be in a range of about 0.8:2.2 to about 1:1.8.

In some embodiments, forming the first metal oxide layer and forming the second metal oxide layer each include varying the flow rate of oxygen during formation.

Another embodiment of the present invention is directed to a method of manufacturing an electrically conductive multilayer stack, the method including: forming a first metal oxide layer including titanium oxide, forming a metal layer on the first metal oxide layer, and forming a second metal oxide layer including titanium oxide on the metal layer, at least one of the forming the first metal oxide layer and the forming the second metal oxide layer including forming a first region, a second region and a third region, the first region and the third region each having a higher oxygen concentration than the second region. In some embodiments, the forming the first metal oxide layer or the second metal oxide layer includes sputtering, evaporation, atomic layer deposition, or chemical vapor deposition.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

In the following description and in the claims, various layers are described as being "on," "over," or "positioned over" one or more additional layers. This language simply denotes the relative positions of the layers. Thus, in some embodiments, two layers are literally right next to each other, while in other embodiments, the same two layers are separated by one or more additional layer(s). In each case, one of the two layers is considered to be "on," "over," or positioned over" the other layer. Also, "on" or "over" can mean "below." For example, a layer that is "on" or "over" another layer can also be considered "below" the other layer, depending upon the point of view.

As used herein, the term "coated substrate" or "coated transparency" refers to a substrate or transparency that has been protected (e.g., coated) with one or more layer(s) of metal and/or metal oxide to provide a conductive layer on the substrate. The substrate or transparency can be made of glass or plastic, coated or uncoated, and may form a window or a windshield of a car, aircraft, boat, building, or any other suitable vehicle or structure.

Embodiments of the present invention are directed to an electrically conductive multilayer stack, which can be used for coating a substrate such as a transparency. In some embodiments, the electrically conductive multilayer stack includes first and second metal oxide layers including titanium oxide, the first metal oxide layer including a first region (e.g., a first sub-layer), a second region (e.g., a second sub-layer) on the first region, and a third region (e.g., a third sub-layer) on the second region, the first region and the third region each having a higher oxygen concentration than that of the second region, and a metal layer (such as a metal layer including gold (Au)) between the first and second metal oxide layers. The first metal oxide layer is positioned over the transparency, and the metal layer is positioned between the first metal oxide layer and the second metal oxide layer. As used herein, the term "titanium oxide" refers to any compound containing only Ti and O as the constituent elements. Some non-limiting examples of suitable titanium oxides include $TiO_2$, $TiO$, $Ti_2O_3$, $Ti_3O$, $Ti_2O$, and derivatives or variations thereof.

Figure 1:
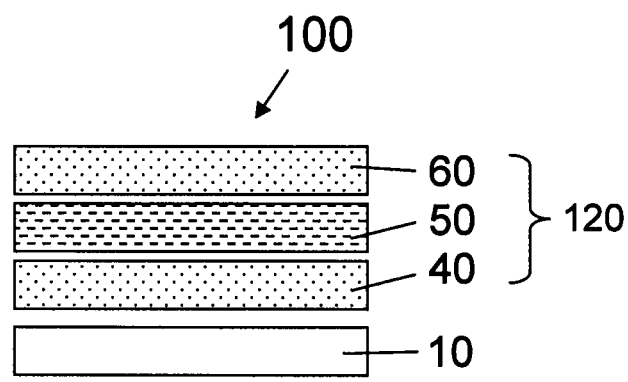
FIG. 1 is an exploded, cross-sectional view of a coated transparency including an electrically conductive multilayer stack according to an embodiment of the present invention.

In some embodiments, a coated transparency 100 includes the above-described electrically conductive multilayer stack. An exemplary coated transparency is shown in FIG. 1. As can be seen in the embodiment of FIG. 1, the coated transparency includes a transparency or substrate 10 (such as an aircraft canopy), and an electrically conductive multilayer stack 120. The electrically conductive multilayer stack includes a first metal oxide layer 40 including titanium oxide adjacent to a metal layer 50, and a second metal oxide layer 60 including titanium oxide adjacent to the metal layer 50. Each of the first and second metal oxide layers and the metal layer may be positioned on or over an adjacent layer in the order shown. One or more of the first metal oxide layer 40 and the second metal oxide layer 60 may include various regions (or sublayers) as described in more detail below. The coated transparency may also include additional layers (not shown in FIG. 1), such as tie, base, and topcoat layers, as desired.

Figure 2:
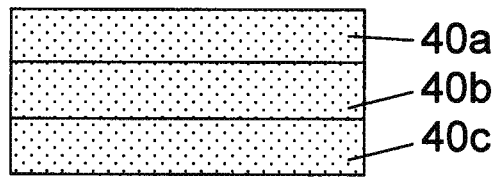
FIGS. 2-7 are exploded, cross-sectional views of coated transparencies according various embodiments of the present invention.

At least one of the first metal oxide layer and the second metal oxide layer includes a first region, a second region on the first region, and a third region on the second region. The first region and the third region each have a higher oxygen concentration than that of the second region. For example, an embodiment in which the first metal oxide layer 40 includes a first region 40a, a second region 40b, and a third region 40c is shown in FIG. 2. As can be seen in the embodiment in FIG. 2, the second region 40b is on the third region 40c, and the first region 40a is on the second region 40b. Alternatively, the second region 40b may be on the first region 40a, and the third region 40c may be on the second region 40b. However, it is understood that the first, second and third regions 40a, b and c may positioned in any order relative to each other, and are not limited to the positions and order described here and depicted in the drawings.

Figure 3:
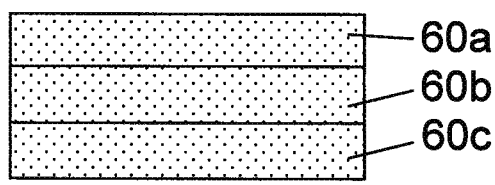
Figure 4:
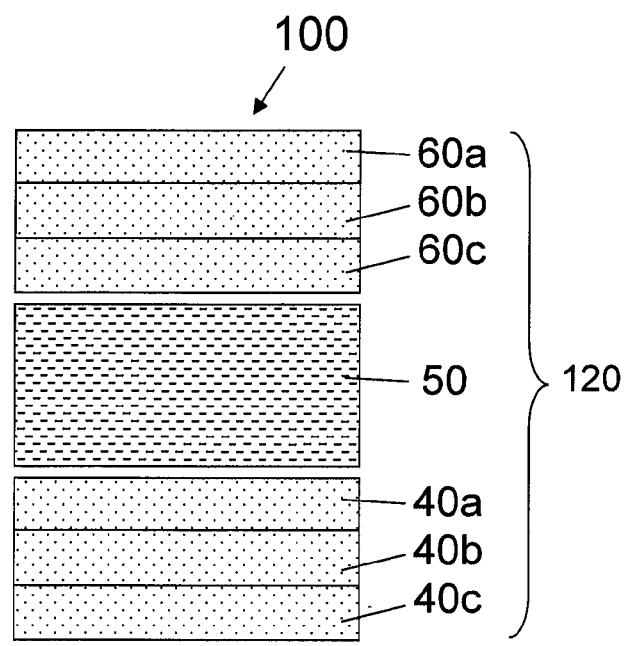

FIG. 3 shows another embodiment in which the second metal oxide layer 60 includes a first region 60a, a second region 60b, and a third region 60c. As can be seen in the embodiment in FIG. 3, the second region 60b is on the third region 60c, and the first region 60a is on the second region 60b. Alternatively, the second region 60b may be on the first region 60a, and the third region 60c may be on the second region 60b. FIG. 4 shows another embodiment in which each of the first metal oxide layer 40 and the second metal oxide layer 60 include a first region, a second region, and a third region. The first region and the third region each have a higher oxygen concentration than that of the second region.

According to embodiments of the present invention, a method of manufacturing an electrically conductive multilayer stack includes: forming a first metal oxide layer including titanium oxide; forming a metal layer on the first metal oxide layer; and forming a second metal oxide layer including titanium oxide on the metal layer, at least one of the forming the first metal oxide layer and the forming the second metal oxide layer including forming a first region, a second region and a third region, the first region and the third region each having a higher oxygen concentration than the second region. The metal oxide layers may be prepared using any suitable process capable of producing a metal oxide layer including a first region, a second region and a third region, the first region and the third region each having a higher oxygen concentration than the second region. For example, the metal oxide layers may be prepared using physical vapor deposition, atomic layer deposition, and chemical vapor deposition (e.g., plasma enhanced chemical vapor deposition). Additionally, the first region, second region and third region may be formed after the deposition of the corresponding metal oxide layer. For example, the metal oxide layer may be deposited first and then subjected to a post deposition treatment to create the first region, second region and third region.

In some embodiments, at least one of the first metal oxide layer or the second metal oxide layer is formed by varying a flow rate of oxygen during formation. The metal oxide layers may be formed by any suitable process, such as, for example, a physical vapor deposition process such as sputtering. The sputtering may include, for example, sputtering from a titanium metal target or $TiO_2$ target, but the present invention is not limited thereto. In some embodiments, both of the first metal oxide layer and the second metal oxide layer are formed by varying the flow rate of oxygen during formation (e.g., while sputtering). By varying the flow rate of oxygen during formation, the oxygen concentration of the metal oxide layer may be varied, thereby forming an oxygen concentration gradient in the formed layer. The different oxygen concentrations in the gradient forming the first, second and third regions of the first metal oxide layer or the second metal oxide layer.

For example, varying the flow rate of oxygen while sputtering may include flowing oxygen at a first oxygen flow rate, then flowing oxygen at a second oxygen flow rate, and then flowing oxygen at a third oxygen flow rate. In some embodiments, a ratio of the first oxygen flow rate to the second oxygen flow rate is in a range of about 10:1 to about 25:1, and a ratio of the third oxygen flow rate to the second oxygen flow rate is in a range of about 10:1 to about 25:1. By varying the oxygen flow rate during formation, the first or second metal oxide layer is formed with first, second and third regions, each region having a different oxygen concentration. Additionally, as described in more detail below, varying the oxygen flow rate may also vary the surface roughness of the first region, the second region, and the third region, thereby varying the surface area of each. For example, forming a region of titanium oxide while flowing oxygen at a higher flow rate results in an increased surface area (or surface energy) as compared to forming a region of titanium oxide while flowing oxygen at a lower flow rate. The increased surface area of a region of titanium oxide formed at higher oxygen flow rate may be observed using transmission electron microscopy (TEM), under which the region of titanium oxide will exhibit a wavier cross-section as compared to a region of titanium oxide formed at a lower flow rate of oxygen, which will exhibit a smoother cross-section under TEM.

In some embodiments, varying the flow rate of oxygen during formation (e.g., while sputtering) further includes flowing a first inert gas at a first inert gas flow rate, then flowing a second inert gas at a second inert gas flow rate, and then flowing a third inert gas at a third inert gas flow rate. For example, a ratio of the first oxygen flow rate to the first inert gas flow rate may be in a range of about 0.8:2.2 to about 1:1.8, a ratio of the second oxygen flow rate to the second inert gas flow rate may be in a range of about 1:29 to about 2:25, and a ratio of the third oxygen flow rate to the third inert gas flow rate may be in a range of about 0.8:2.2 to about 1:1.8. By flowing inert gases at the foregoing flow rates, the oxygen concentration of the first region, the second region, or the third region may be further controlled.

In some embodiments, flowing inert gas at the first inert gas flow rate is performed simultaneously with flowing oxygen at the first oxygen flow rate, flowing inert gas at the second inert gas flow rate is performed simultaneously with flowing oxygen at the second oxygen flow rate, and flowing inert gas at the third inert gas flow rate is performed simultaneously with flowing oxygen at the third oxygen flow rate. The first, second and third inert gases can be the same or different. In some embodiments, each of the first inert gas, second inert gas and the third inert gas are all the same (e.g., Ar).

The duration of the deposition process will depend upon the deposition process being used and the characteristics of the electrically conductive multilayer stack, such as the size of the substrate (e.g., the area) on which the electrically conductive multilayer stack is being deposited and the thickness of each of the various layers of the electrically conductive multilayer stack. For example, the duration of the sputtering process will depend upon the size of the target, the power applied to the target, and because the target may move, the number of passes that the target makes over the substrate. The substrate may also move during the deposition process. In consideration of the above-described variables, the deposition process may be carried out for a period of time sufficient to form the first region, the second region, and/or the third region to an appropriate thickness.

For example, the first region may have a thickness in a range of about 0.5 to about 6 nm, such as in a range of about 2 to about 6 nm. Similarly, the third region may have a thickness in a range of about 0.5 to about 6 nm, such as in a range of about 2 to about 6 nm. The second region may have a thickness in a range of about 3 to about 8 nm. Additionally, a ratio of the thickness of the first region to that of the second region may be in a range of about 0.0625:1 to about 1:1, such as in a range of about 0.25:1 to about 1:1. Similarly, a ratio of the thickness of the third region to that of the second region may be in a range of about 0.0625:1 to about 1:1, such as in a range of about 0.25:1 to about 1:1.

As described above, the second region may have a lower oxygen concentration than that of each of the first region and the third region. For example, as set forth above, the second region may be formed by flowing oxygen at a lower flow rate (i.e., lower relative to the oxygen flow rates for either the first region or the third region) during formation. As a result of the second region having a lower oxygen concentration than that of each of the first region and the third region, the second region has improved light transmission properties as compared to the first region and the third region. Consequently, metal oxide layers including first, second and third regions have improved light transmission properties as compared to metal oxide layers that only include a first region and/or a third region.

Additionally, by having a higher oxygen concentration than the second region (e.g., by being formed at a higher oxygen flow rate than that of the second layer), each of the first region and the third region has greater surface roughness than the second region (e.g., the region of lower oxygen concentration). The increased oxygen concentration, and hence increased surface roughness and increased surface area (or surface energy), of the first region and the third region, relative to the second region, improves the adhesion of the metal oxide layer to the substrate or other layers (non-limiting examples of which include metal layers, tie layers, base layers, topcoat layers or the like). For example, metal oxide layers including first and third regions, with higher surface roughness than the second region, have improved adhesion to the substrate as compared to metal oxide layers including only a second region (e.g., a region of relatively lower oxygen concentration). Consequently, the multi-region metal oxide layer described above achieves greater adhesion to at least some of the components of the coated transparency than can be achieved by a metal oxide layer that only includes the second region. Thus, the multi-region metal oxide layer described above has improved adhesion and light transmission properties as compared to metal oxide layers that have only a single region (i.e., a single oxygen concentration) or that do not vary the oxygen concentration as described here.

In some embodiments, the coated transparency 100 provides the functionality required of a modern stealth aircraft canopy. For example, in some embodiments, the electrically conductive multilayer stack 120 has a sheet resistance suitable for radar attenuation. More specifically, one or more of the first and second metal oxide layers and the metal layer may be electrically conductive and have a sheet resistance suitable for radar attenuation. When positioned over a transparency or substrate, such as an aircraft canopy, an electrically conductive multilayer stack having a sheet resistance suitable for radar attenuation can prevent or reduce the buildup of static charge on the coated transparency by draining or dissipating the static charge, and it can provide radar attenuation functionality to the coated transparency.

Additionally, some embodiments of the electrically conductive multilayer stack are transparent and, for example, have a visible light transmittance of at least about 61%. In some embodiments, for example, the electrically conductive multilayer stack may have a visible light transmittance in a range of about 61% to about 67%. More specifically, one or more of the first and second metal oxide layers of the electrically conductive multilayer stack may be transparent and/or anti-reflective. Consequently, a coated transparency or substrate, such as an aircraft canopy, including the electrically conductive multilayer stack may be transparent and, for example, have a visible light transmittance of at least about 61%. The light transmittance may be further improved by including a topcoat on the electrically conductive multilayer stack. For example, including a topcoat on the electrically conductive multilayer stack may increase the light transmittance of the coated transparency above 65%.

In some embodiments, the electrically conductive multilayer stack includes first and second metal oxide layers including titanium oxide, which, according to embodiments of the invention, has a higher refractive index than certain other transparent conductive metal oxides, such as indium tin oxide ITO and AZO. As a result of its higher refractive index, a titanium oxide layer does not need to be made as thick as a corresponding ITO or AZO layer in order to achieve roughly the same anti-reflective properties. By making the metal oxide layer thinner, the flexibility of the metal oxide layer, as measured by strain elongation, can be improved over previous coatings including ITO or AZO, as described in more detail below. Although an AZO layer generally has higher flexibility than a titanium oxide layer of the same thickness, the metal oxide layers including titanium oxide of embodiments of the present invention can be ultra-thin and therefore, have a higher flexibility than the thicker AZO layers of previous coatings. As such, an electrically conductive multilayer stack including ultra-thin titanium oxide according to embodiments of the present invention may be more flexible than previous electrically conductive multilayer stacks including thicker layers of ITO or AZO. For example, the improved flexibility of the ultra-thin metal oxide layers including titanium oxide may improve the overall flexibility of a coating including those layers. Additionally, titanium oxide films, such as those included in embodiments of the present invention have good light transmittance in the visible light region (e.g., ~85%), a high refractive index (e.g., ~2.1). Titanium oxide also has better environmental stability (e.g., chemical stability, such as resistance to corrosion induced by water or acid) and mechanical durability than other metal oxides.

Because of the relatively higher refractive index of titanium oxide, a titanium oxide layer may be made thinner than other metal oxide layers such as ITO and AZO and still result in an acceptable amount of destructive interference in the visible light reflected by the first and second metal oxide layers and the metal layer, thereby resulting in an acceptable amount of visible light that is reflected (and consequently an acceptable amount of visible light that is transmitted). Although the anti-reflective properties and visible light transmittance of anti-reflective coatings (such as ITO, AZO and titanium oxide) depend on the relative refractive index of the anti-reflective coating, those properties also depend on the thickness of the anti-reflective coating. Anti-reflective coatings that have a thickness equal to one quarter of the wavelength of visible light (e.g., light having a wavelength of about 400 nm to about 750 nm, or about 550 nm), depending upon the refractive index of the metal oxide, produce destructive interference in the reflected visible light, thereby canceling the reflected visible light and increasing the amount of transmitted visible light. That is, when the thickness of the anti-reflective coating is equal to one quarter of the wavelength of the visible light, the visible light reflected by the anti-reflective coating (i.e., the metal oxide layer) will be out of phase with the visible light reflected by the metal layer, and the visible light reflected from the anti-reflective coating and the metal layer will be canceled as a result of destructive interference. Consequently, the light that would have been reflected by the anti-reflective coating (i.e., the metal oxide layer) and the metal layer is instead transmitted through the anti-reflective coating and the metal layer. Because ITO has to be made ultra-thin to pass the below-described four point bend test, the thicknesses of previous ITO layers were substantially less than one quarter of the wavelength of visible light, thereby limiting the amount of destructive interference produced by those ITO layers and reducing the amount of visible light transmitted. In contrast to the ultra-thin ITO layers, the presently described first and second metal oxide layers, which may include titanium oxide, can be made thinner and still provide acceptable anti-reflective properties. Also, since the titanium oxide layers are made thinner, they are more flexible and can more easily pass the four point bend test. As such, an electrically conductive multilayer stack according to embodiments of the present invention provides suitable anti-reflective properties and visible light transmittance.

In some embodiments, the first metal oxide layer has a thickness in a range of about 4 to about 20 nm, such as about 5 to about 15 nm, about 8 to about 15 nm, or about 10 to about 15 nm. Additionally, in some embodiments, the second metal oxide layer has a thickness in a range of about 4 to about 20 nm, such as about 5 to about 15 nm, about 8 to about 15 nm, or about 10 to about 15 nm. An electrically conductive multilayer stack according to embodiments of the present invention may include metal oxide layers having the above-described thicknesses and still pass the four point bend test. In contrast, an electrically conductive multilayer stack including an ITO metal oxide layer would typically need to have an ITO layer having a thickness of greater than 20 nm to have suitable anti-reflective properties, and would lack the flexibility necessary to pass the below-described four point bend test. Because an electrically conductive multilayer stack including titanium oxide metal oxide layers of embodiments of the present invention are more flexible than, for example, a comparable electrically conductive multilayer stack including ITO metal oxide layers, the electrically conductive stacks of embodiments of the present invention are more flexible, and hence more durable (i.e., have superior mechanical properties), than certain previous multilayer stacks.

The present inventors have also discovered that electrically conductive multilayer stacks according to some embodiments of the present invention, e.g., electrically conductive multilayer stacks including metal layers including gold, exhibit better corrosion resistance and durability than certain previous coatings. Because gold is less susceptible to corrosion than certain other metals, such as silver, electrically conductive multilayer stacks including gold layers are less susceptible to corrosion than certain previous coatings (e.g., those including silver layers). Consequently, electrically conductive multilayer stacks including gold metal layers are less likely to suffer from degradation of electrical (e.g., sheet resistance) and optical properties (e.g., visible light transmittance), resulting in improved durability of coated transparencies including such multilayer stacks.

In some exemplary embodiments, the electrically conductive multilayer stack includes a first metal oxide layer 40 including titanium oxide, a metal layer 50 including gold, and a second metal layer 60 including titanium oxide. The first metal oxide layer 40 is positioned over a transparency 10, the metal layer 50 is positioned over the first metal oxide layer 40, and the second metal oxide layer 60 is positioned over the metal layer 50. For instance, the metal layer may have a thickness in a range of about 5 to about 20 nm. Additionally, in some embodiments, the metal layer consists essentially of gold. As used herein and in the claims that follow, the term "consisting essentially of gold" and "consisting essentially of" means that the metal layer primarily contains gold, but may contain other substances that do not affect the corrosion resistance, sheet resistance and/or radar attenuation properties of the gold. For instance, a metal layer consisting essentially of gold would be substantially free, or even completely free, of silver (Ag). As used herein, the term "substantially" is used as a term of approximation and not a term of degree, such that the term "substantially free" means that the material being discussed is present in the composition, if at all, as an incidental impurity. As used herein, the term "completely free" means that the material is not present in the composition at all.

Because gold is less susceptible to corrosion than, for example, silver, a coated transparency including an electrically conductive multilayer stack including a metal layer including gold does not require additional protective organic layers, such as a barrier layer, to protect the metal layer from oxidation. For example, a coated transparency according to some embodiments of the present invention includes an electrically conductive multilayer stack including a first metal oxide layer including titanium oxide (e.g., first metal oxide layer 40), a metal layer including gold (e.g., metal layer 50), and a second metal oxide layer including titanium oxide (e.g., second metal oxide layer 60), with the proviso that the coated transparency does not include a barrier layer. As a result, such electrically conductive multilayer stacks can be less complicated and less costly to produce than certain previous stacks (i.e., because it does not require additional protective organic layers, such as a barrier layer, to protect the metal layer from oxidation). By eliminating the barrier layer, the coated transparencies of some embodiments of the present invention can be produced in fewer steps and with fewer materials than certain previous transparencies, thereby reducing cost and increasing efficiency of production.

Nonetheless, some embodiments of the coated transparency of the present invention may include one or more additional layer(s), such as those set forth below. For example, in some embodiments, the coated transparency further includes a topcoat (e.g., a conductive top layer including a conductive metal oxide, a quaternary ammonium salt, an inherently conductive polymer, and/or other suitable conductive agent), a base layer(s) (e.g., a layer including a material selected from polyepoxides, polyacrylates, polyurethanes, polysiloxanes, and combinations thereof), and/or a tie layer(s) (e.g., an acrylic polymer and/or mixture of polymers), such as those described in U.S. Patent Application Publication No. 2010/0025533 and U.S. Patent Application Publication No. 2010/0028684, the entire contents of which are herein incorporated by reference.

Figure 5:
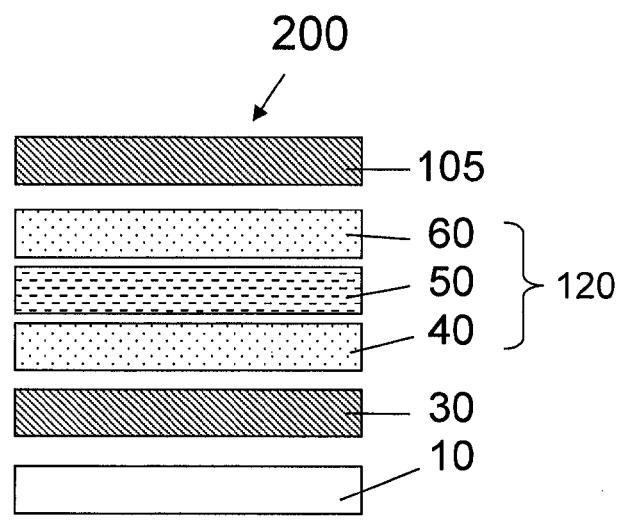

For example, another embodiment of the present invention is shown in FIG. 5. According to this embodiment, a coated transparency 200 includes a substrate 10 (e.g., a transparency), a polymeric base layer 30, an electrically conductive multilayer stack 120, and a topcoat or top layer 105. Each of the layers of the coated transparency may be positioned on or over an adjacent feature (or layer) in the order shown in FIG. 5. Although not shown, the coated transparency may also include an adhesion promoter (e.g., an adhesion promoter layer), such as 3-aminopropyltriethoxysilane, between the substrate and the subsequent layers. The substrate and electrically conductive multilayer stack are similar to those described above with reference to FIG. 1.

In the embodiment shown in FIG. 5, the topcoat or top layer 105 is in direct physical contact with the second metal oxide layer 60. However, it is understood that the present invention is not limited to this configuration, and there may be one or more intervening layers or features between the second metal oxide layer and the topcoat. The topcoat or top layer 105 is the outer most layer of the multilayer stack 200, and is made of a tough, durable and weather resistant material, such as polyurethane, yet is sufficiently pliable and flexible to prevent crack formation due to thermal stress. The topcoat may include conductive compounds to provide anti-static properties, and the topcoat may be conductive and help dissipate static charge and other electromagnetic forces. The topcoat has antistatic properties and allows static charge to be dissipated to the underlying conductive layer(s). For example, the coated transparency may include a topcoat (e.g., a conductive top layer including a conductive metal oxide, a quaternary ammonium salt, an inherently conductive polymer, and/or other suitable conductive agent) as described in U.S. Patent Application Publication No. 2010/0025533 and U.S. Patent Application Publication No. 2010/0028684. In some embodiments, the topcoat includes polyurethane.

In some embodiments, the topcoat includes both a hydrophobic component and a hydrophilic component. The hydrophobic component may include a fluorinated carbon backbone and the hydrophilic component may include a polyether chain (e.g., a polyethylene glycol chain). For example, the topcoat may include a reaction product of a hydrophobic precursor including a fluorinated carbon backbone and at least one hydroxyl group and a hydrophilic precursor including a polyether chain and at least one isocyanate group. The topcoat may be formed by mixing a Part A mixture, which includes compounds having one or more reactive groups (e.g., hydroxyl groups), with a Part B mixture, which includes compounds having one or more isocyanate groups. The part A mixture may include, for example, any or all of at least one aliphatic polyester polyol with a functionality of two or more (e.g., a mixture of aliphatic polyester polyols, each polyol having two or more hydroxyl groups), a first fluorinated compound having a fluorinated carbon backbone (e.g., a first hydrophobic precursor), a second fluorinated compound having a fluorinated carbon backbone (e.g., a second hydrophobic precursor), a migratory ultraviolet light (UV) absorber, a reactive UV absorber, a migratory UV stabilizer, a reactive UV stabilizer, anti-static agents (e.g., the above-described conductive compounds), a catalyst, a flow control agent and solvents.

Non-limiting examples of the aliphatic polyester polyols include polycaprolactone polyols of various molecular weights in a range of 300 to 5,000 g/mole and various functionalities (e.g., 2, 3, and 4). Commercially available examples of the aliphatic polyester polyols include Capa™ 2101, Capa™ 3031, Capa™ 3041 and Capa™ 4101, each of which are available from Perstop. Non-limiting commercially available examples of the anti-static agents include Antistat SD100 (available from E.I. du Pont de Nemours and Company), EA Antistat (available from Wells Plastics Ltd), and MAXOMER® AS-1018/75DC (available from PCC Chemax, Inc.). MAXOMER® is a registered trademark of PCC Chemax, Inc.

The first fluorinated compound having a fluorinated carbon backbone (e.g., the first hydrophobic precursor) may be a compound having one reactive group, such as a hydroxyl group. That is, the first fluorinated compound having a fluorinated carbon backbone may be monofunctional. By having one reactive group, the first fluorinated compound having a fluorinated carbon backbone may be a migratory fluorinated compound capable of migrating to a surface of the topcoat during formation of the topcoat. While the extent of the migration of the migratory fluorinated compound is not fully known, based on the acid resistance of the topcoat and the observed contact angle of water on the topcoat, it is believed that at least some of the migratory fluorinated compound migrates to the surface of the finished topcoat.

Accordingly, the finished topcoat may include the first fluorinated compound having a fluorinated carbon backbone at a surface of the topcoat. In some embodiments, the first fluorinated compound having a fluorinated carbon backbone is a partially perfluorinated compound (e.g., in certain portions of the compound most or all of the hydrogen atoms have been replaced with fluorine atoms, while other portions of the compound include hydrogen bonded to carbon) having a hydroxyl group or a perfluorinated compound having a perfluorinated carbon backbone and a hydroxyl group. By including the first fluorinated compound having a fluorinated carbon backbone at a surface of the topcoat, the hydrophobicity and acid resistance of the surface of the topcoat are improved, thereby improving the corrosion resistance of the topcoat and the transparency including the topcoat. Non-limiting examples of the first fluorinated compound include partially perfluorinated aliphatic compounds. For example, commercially available perfluorinated aliphatic compounds and/or solutions of perfluorinated aliphatic compounds such as, for example, N-ethyl-N-(2-hydroxyethyl)perfluorooctyl-sulphonamide (e.g., FLUORAD™ FC-10; available from 3M Company); and 3,3,4,4,5,5,6,6,7,7,8,8,8-tridecafluoro-1-octanol (e.g., CAPSTONE™ 62-AL), and perfluoroalkyl-1-ethanol (e.g., ZONYL® BA) (each available from E.I. du Pont de Nemours and Company) may be used. ZONYL® is a registered trademark of E.I. du Pont de Nemours and Company.

The second fluorinated compound having a fluorinated carbon backbone may be a compound having two or more reactive groups, such as hydroxyl groups. That is, the second fluorinated compound having a fluorinated carbon backbone may be multifunctional. For example, the second fluorinated compound having a fluorinated carbon backbone may be bifunctional, such as a compound having two hydroxyl groups. As a result of having two or more reactive functional groups, the second fluorinated compound having a fluorinated carbon backbone can react to form a three-dimensional network. In contrast to the first fluorinated compound having a fluorinated carbon backbone, the majority of the second fluorinated compound having a fluorinated carbon backbone does not migrate to a surface of the topcoat and instead remains at an interior of the topcoat (e.g., in the bulk material of the topcoat).

The rigidity of the three-dimensional network formed using the second fluorinated compound having a fluorinated carbon backbone affects the resiliency of the topcoat. Similarly, the non-fluorinated polyols (such as the aliphatic polyester polyols) present in the coating composition also contribute to the resiliency of the finished topcoat. As an example, the rigidity of the three-dimensional network is influenced, in part, by the number of reactive functional groups contained in the second fluorinated compound having a fluorinated carbon backbone. Thus, the number of reactive functional groups of the second fluorinated compound having a fluorinated carbon backbone will affect the resilience of the topcoat. Similarly, the number of hydroxyl groups included in the non-fluorinated polyols will also affect the resiliency of the finished topcoat. In general, with greater crosslink density, which is directly related to the number of reactive functional groups (e.g., hydroxyl groups), the coating generally becomes more rigid with improved chemical and solvent resistance with decreased abrasion resistance. The resiliency of the finished topcoat is also influenced by the size and type of the backbone of the fluorinated and non-fluorinated compounds in the coating composition. When the coating composition includes compounds that have more rigid backbone structures, the resultant topcoat will also be more rigid, while compounds that have relatively more flexible backbone structures will produce a finished compound that has relatively more resiliency.

Accordingly, the desired resiliency of the finished topcoat may be achieved by appropriately selecting the number of reactive functional groups (e.g., hydroxyl groups) of the fluorinated compounds or the non-fluorinated compounds. For example, a second fluorinated compound having a fluorinated carbon backbone and two reactive functional groups will form a three-dimensional network that is more flexible than a three-dimensional network formed by a second fluorinated compound having a fluorinated carbon backbone and three reactive groups. Similarly, a second fluorinated compound having a fluorinated carbon backbone and three reactive functional groups will form a three-dimensional network that is more flexible than a three-dimensional network formed by a second fluorinated compound having a fluorinated carbon backbone and four reactive groups. Increasing the flexibility of the three-dimensional network formed from the second fluorinated compound having a fluorinated carbon backbone and two hydroxyl groups increases the resiliency of the topcoat. Thus, in some embodiments, it is desirable to form a topcoat using a bifunctional second fluorinated compound having a fluorinated carbon backbone (e.g., a compound having two hydroxyl groups) which provides a topcoat having increased resilience over a topcoat formed using a trifunctional or tetrafunctional second fluorinated compound having a fluorinated carbon backbone. The above-described principles are also applicable to the non-fluorinated compounds. For example, desirable resiliency of the finished topcoat may be achieved using an appropriate mixture of non-fluorinated di-functional and tetra-functional polyester polyols.

Non-limiting examples of the second fluorinated compound having a fluorinated carbon backbone include fluoropolymers and fluoropolymer precursors. For example, commercially available pure resins and/or solutions of fluoropolymers and/or fluoropolymer precursors such as LUMIFLON® LF 600X, LUMIFLON® LF 9716, LUMIFLON® LF 9721, LUMIFLON®-910LM and LUMIFLON® LF 916F (available from Asahi Glass Co., Ltd.); FLUOROLINK® D10-H, FLUOROLINK® E10-H, FLUOROLINK® D, FOMBLIN® ETX, FOMBLIN® MF-402 and FLUOROBASE Z-1030 (each available Solvay Solexis, Inc.); and POLYFOX® PF-656 and POLYFOX® PF-7002 (available from Omnova Solutions) may be used. LUMIFLON® is a registered trademark of Asahi Glass Co., Ltd., FLUOROLINK® is a registered trademark of Solvay Solexis, Inc, FOMBLIN® is a registered trademark of Solvay Fluorati Holding S.P.A., Corporation and POLYFOX® is a registered trademark of Ampac Fine Chemicals LLC.

The migratory UV absorber and reactive UV absorber may be based upon any suitable UV absorber. The migratory UV absorber does not include a reactive functional group and migrates to a surface of the topcoat during the formation (e.g., curing) of the topcoat. By forming the topcoat using the migratory UV absorber, the finished topcoat includes a higher concentration of the UV absorber at a surface of the topcoat than does a topcoat formed without using a migratory UV absorber. Having a higher concentration of UV absorber at a surface of the topcoat improves the lifetime of the topcoat. However, it is desirable to also have UV absorbers in the bulk of the topcoat, as having UV absorbers both at the surface of the topcoat and in the topcoat will extend the lifetime of the topcoat as compared to a topcoat that only includes UV absorbers at the surface. Additionally, if the compounds migrate to a surface of the topcoat too quickly, the topcoat may form a haze. Accordingly, a topcoat according to embodiments of the present invention may be formed using the reactive UV absorber as well. The reactive UV absorber may include one or more reactive functional groups, such as a hydroxyl group. By including the reactive groups, a majority of the reactive UV absorber does not migrate to a surface of the topcoat and instead remains in the interior of the topcoat (e.g., in the bulk material of the topcoat). Additionally, if the reactive UV absorber is multifunctional, it may contribute to the formation of the three-dimensional network. Non-limiting examples of the UV absorber include 2-(2H-benzotriazol-2-yl)-4,6-ditertpentylphenol (e.g., TINUVIN® 328), propanoic acid,2-[4-[4,6-bis([1,1'-biphenyl]-4-yl)-1,3,5-triazin-2-yl]-3-hydroxyphenoxy]-,isooctyl ester (e.g., TINUVIN® 479), 2-(2H-benzotriazole-2-yl)-6-(1-methyl-1-phenylethyl)-4-(1,1,3,3-tetramethylbutyl)phenol (e.g., TINUVIN® 928), β-[3-(2-H-benzotriazole-2-yl)-4-hydroxy-5-t-butylphenyl]-propionic acid-poly(ethylene glycol) 300 ester and bis{β-[3-(2-H-benzotriazole-2-yl)-4-hydroxy-5-t-butylphenyl]-propionic acid}-poly(ethylene glycol) 300 ester (e.g., TINUVIN® 1130), and 2-[4-[(2-hydroxy-3-(2'-ethyl)hexyl)oxy]-2-hydroxyphenyl]-4,6-bis(2,4-dimethylphenyl)-1,3,5-triazine (e.g., TINUVIN® 405) (each available from BASF Resins); and p-phenylenebis (methylenemalonic acid)tetraethyl ester (e.g., HOSTAVIN® B-CAP), 2-ethyl,2'-ehtoxy-oxalanilide (e.g., HOSTAVIN® VSU), and propanedioic acid,2[(4-methoxyphenyl)methylene]-,1,3-dimethylester (e.g., HOSTAVIN® PR-25) (each available from Clariant International Ltd.). TINUVIN® is a registered trademark of Ciba Specialty Chemical Corporation. HOSTAVIN® is a registered trademark Hoechst GMBH Corporation.

The migratory UV stabilizer and reactive UV stabilizer may be based upon any suitable UV stabilizer, such as any suitable free radical scavenger. The migratory UV stabilizer and reactive UV stabilizer reduce the degradation of the topcoat by UV light by scavenging free radicals formed by the dissociation of chemical bonds as a result of UV light absorption. The migratory UV stabilizer does not include a reactive functional group and migrates to a surface of the topcoat during the formation of the topcoat. By forming the topcoat using the migratory UV stabilizer, the finished topcoat includes a higher concentration of the UV stabilizer at a surface of the topcoat than does a topcoat formed without using a migratory UV stabilizer. Having a higher concentration of UV stabilizer at a surface of the topcoat improves the lifetime of the topcoat. However, it is desirable to also have UV stabilizers in the bulk of the topcoat, as having UV stabilizers both at the surface of the topcoat and in the topcoat will extend the lifetime of the topcoat as compared to a topcoat that only includes UV stabilizers at the surface. Additionally, if the compounds migrate to a surface of the topcoat too quickly, the topcoat may form a haze. Accordingly, a topcoat according to embodiments of the present invention may be formed using the reactive UV stabilizer as well. The reactive UV stabilizer may include one or more reactive functional groups, such as a hydroxyl group. By including the reactive groups, a majority of the reactive UV stabilizer does not migrate to a surface of the topcoat and instead remains in the interior of the topcoat (e.g., in the bulk material of the topcoat). Additionally, if the reactive UV stabilizer is multifunctional, it may contribute to the formation of the three-dimensional network. Non-limiting examples of the UV stabilizer include propanedioic acid [(4-methoxyphenyl)-methylene]-bis(1,2,2,6,6-pentamethyl-4-piperidinyl)ester (e.g., HOSTAVIN® PR-31; available from Clariant International Ltd.) and commercially available hindered aminoether light stabilizers such as TINUVIN® 123, TINUVIN® 292 and TINUVIN® 152 (each available from BASF Resins). TINUVIN® is a registered trademark of Ciba Specialty Chemical Corporation. HOSTAVIN® is a registered trademark Hoechst GMBH Corporation.

The Part B mixture may include a first isocyanate compound having a functionality of 3 or more (e.g., having 3 or more isocyanate functional groups) and a second isocyanate compound having a functionality of 2 or more (e.g., having 2 or more isocyanate functional groups). The first isocyanate compound may be an aliphatic polyisocyanate including a polyethylene glycol chain to increase the hydrophilicity of the interior of the topcoat, which helps dissipate electrical charge. For example, the first isocyanate compound may be any suitable aliphatic polyisocyanate, such as a hydrophilically modified aliphatic polyisocyanate based on isophorone diisocyanate. Non-limiting examples of the first and second isocyanate compounds include methylene bis-(4-cyclohexylisocyanate) (e.g., DESMODUR® W), 1,6-hexamethylene diisocyanate based polyisocyanate (e.g., DESMODUR® N-75, DESMODUR® N-3200, and/or DESMODUR® N-3300), isophorone diisocyanate based polyisocyanate (e.g., DESMODUR® Z-4470), hexamethylene diisocyanate based polyisocyanate (e.g., BAYHYDUR® 302, BAYHYDUR® 303, BAYHYDUR® 304, and/or BAYHYDUR® 305), isophorone diisocyanate based hydrophilically modified aliphatic polyisocyanate (e.g., BAYHYDUR® 2150BA and/or BAYHYDUR® 401-70) (each available from Bayer Material Science). DESMODUR® and BAYHYDUR® are registered trademarks of Bayer Material Science.

The topcoat may be formed by mixing the above-described Part A mixture with the Part B mixture. The topcoat composition, after the Part A mixture and the Part B mixture are mixed together and cured, forms a durable, anti-static polyurethane coating which is highly weatherable, abrasion resistant, acid resistant and resistant to chemicals or solvents.

In the case of a modern aircraft canopy, the substrate is typically an organic resin such as polycarbonate or polyacrylate. Hence, the polymeric base layer 30 is selected to adhere well to such a material. The base layer covers the imperfections of the substrate and promotes adhesion of the first metal oxide layer to the substrate. That is, the base layer 30 couples the canopy (i.e., the transparency) to the electrically conductive multilayer stack 120, and should be capable of bonding thereto. The base layer should be hard enough to support the ceramic metal oxide antireflective coating, and the base layer should not adversely affect the impact resistance of the substrate. Additionally, a soft tie coat may be positioned between the base layer and the substrate. The tie coat dissipates the shrinkage stress that results from the addition of the other layers (e.g., the base layer and the electrically conductive multilayer stack 120), and the tie coat accommodates the dimensional change of the substrate due to extreme thermal exposure.

In some embodiments of the invention, the base layer 30 includes a material selected from polyepoxides, polyacrylates, polyurethanes, polysiloxanes, and combinations thereof. A polysiloxane base layer may be particularly useful as a result of its inorganic composition and hardness. As such, the base layer 30 may include a polymeric and/or oligomeric silane, among other species. For example, a coating composition may be prepared from a combination of monomeric silanes and silane terminated polymers that are hydrolyzed in a mixture of water and acid to form silanols, which are condensed to a precondensate state after being formed. When the coating composition is applied to a surface and cured, the precondensate, which includes the silanols, reacts to form siloxane linkages, thereby forming an exemplary polysiloxane base layer 30. Alternatively, the base layer 30 may include any suitable polyepoxide, polyacrylate, or polyurethane. For example, the base layer 30 may include a thermally-curable polyacrylate coated with the above-described polysiloxane.

Figure 6:
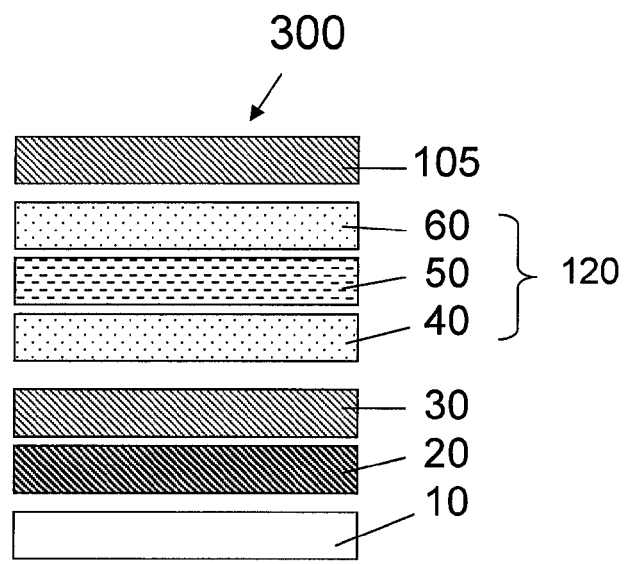

Another embodiment of the present invention is shown in FIG. 6. According to this embodiment, a coated transparency 300 includes a transparency 10 (i.e., a substrate), a base layer 30, an electrically conductive multilayer stack 120, and a topcoat 105, as described above. The coated transparency further includes a tie layer 20 between the transparency 10 and the base layer 30.

In the case where the substrate is a polyacrylate, polycarbonate, or similar organic resin, the tie layer 20 can be an acrylic polymer or mixture of polymers, for example an acrylic polymer made of one or more alkyl acrylates and/or methacrylates. Optionally, the tie layer may also include one or more additional adhesion promoters, such as additional monomers. The layer can be applied to the substrate by gravity coating or another suitable application technique. In gravity coating, a polymeric solution of the tie layer polymer(s) or precursor monomers is prepared, and the solution is applied to the canopy in the center and along a longitudinal axis that extends along the entire length of the canopy. The polymeric solution is then discharged from a nozzle and poured over the canopy at the top, allowing the solution to flow down both sides and thereby coat the surface of the canopy. The solution is applied slowly from one end to another along the longitudinal axis of the canopy, until the entire canopy is coated with a tie layer. The coating thickness can be controlled by, for example, the viscosity of the polymeric solution. The liquid coating can be applied by multiple passes to ensure a consistent layer is formed across the canopy. Any excess drips off the canopy are collected at the bottom, through a gutter, where they can be properly disposed of and/or re-used.

In another embodiment, multiple streams of the polymeric solution are directed to impinge on the canopy. The solution streams are ejected through one or more nozzles or other outlets at a constant flow rate. By keeping the flow rate of the polymeric solution constant, the thickness of the coating can be controlled. In addition to the flow rate, the thickness of the coating also depends on the viscosity of the polymeric solution. Increasing the viscosity of the polymeric solution increases the thickness of the coating. In some embodiments, the viscosity of the polymeric solution is in a range of about 2 to about 200 centipoise. Once the canopy is coated with the tie layer material(s), it is air dried under atmospheric conditions and ambient temperatures, and then cured using heat or ultraviolet light.

After the tie layer 20 is applied to the substrate 10 and cured, the base layer 30 is applied by gravity coating or a process similar to that described above. The substrate, including the tie layer 20 and the base layer 30, is then allowed to air dry under ambient conditions, and is then cured.

The first metal oxide layer 40 is applied to the base layer 30 by any suitable process, such as, for example, sputtering. In one exemplary embodiment, the first metal oxide layer is formed using a magnetron sputtering process in which a high voltage plasma discharge causes atoms to be ejected from a target, such as a titanium metal or $TiO_2$ target. The metal or metal oxide then strike the base layer and form a thin, transparent layer of metal oxide. Since the coating is formed on an atomic scale, it is possible to produce uniform layers of films. For titanium oxide, the metal oxide layer 40 can be applied at a relatively moderate temperature, i.e. from about 100° F. to about 200° F. The substrate, including the tie layer 20 and the base layer 30, is heated to a temperature within that range, and a sufficiently thick layer is deposited thereon. Additionally, as described above, forming the first metal oxide layer or the second metal oxide layer may include varying the flow rate of oxygen while sputtering. The target may move during the sputtering process and the target may make multiple passes over the substrate.

In an exemplary embodiment, the titanium oxide film is formed using pulsed DC magnetron sputtering in an argon and $O_2$ gas mixture at a temperature of about 100 to about 200° F.

Once the first metal oxide layer 40 is applied, the metal layer 50 is applied using a physical vapor deposition or sputtering process as described above. For gold, the deposition process can be carried out at a temperature of about 100° F. to about 200° F. After the metal layer 50 is deposited, the second metal oxide layer 60 is then applied, using a process similar to that described above with respect to the first metal oxide layer 40.

After the electrically conductive multilayer stack 120 is formed, a topcoat may be formed thereon. For example, as shown in FIGS. 5 and 6, the topcoat 105 may be formed directly on the second metal oxide layer 60 to provide a topcoat 105 that is in direct physical contact with the second metal oxide layer 60.

Figure 7:
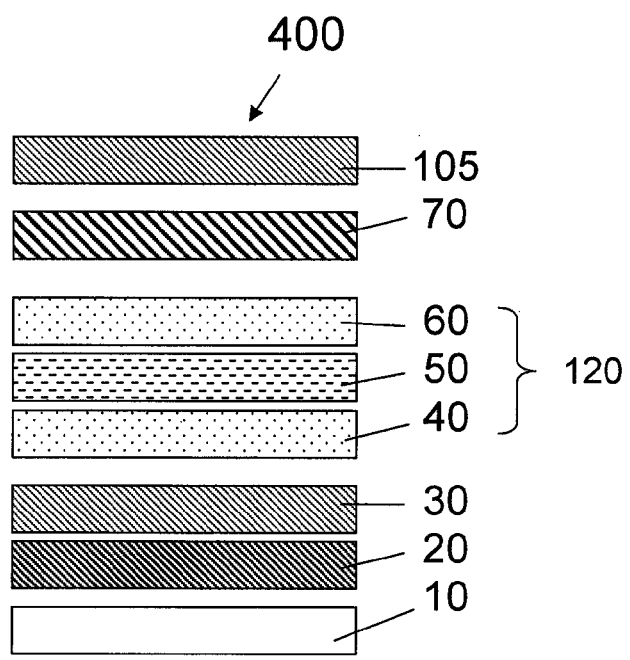

Alternatively, the coated transparency may include a tie layer (e.g., a conductive tie layer) between the electrically conductive stack and the topcoat, as shown in FIG. 7. According to the embodiment shown in FIG. 7, the coated transparency includes a substrate 10 (e.g., a transparency), a tie layer 20, a base layer 30, an electrically conductive multilayer stack 120, and a topcoat 105, as described above. The coated transparency further includes a topcoat tie layer 70 between the topcoat 105 and the electrically conductive multilayer stack 120. In one embodiment, the topcoat tie layer 70 includes a polymeric resin that is compatible with the topcoat 105 and optionally includes an organosiloxane compound, which can interact with and bond to the second metal oxide layer 60 of the electrically conductive multilayer stack 120. The topcoat 105 may be made of a durable, weather resistant polymer, such as polyurethane. For example, the topcoat tie layer and topcoat may include a tie layer (e.g., an acrylic polymer and/or mixture of polymers) or topcoat (e.g., a conductive top layer including a conductive metal oxide, a quaternary ammonium salt, an inherently conductive polymer, and/or other suitable conductive agent), respectively, such as those described in U.S. Patent Application Publication No. 2010/0025533 and U.S. Patent Application Publication No. 2010/0028684.

The following examples are presented for illustrative purposes only and are not to be viewed as limiting the scope of the present invention. Unless otherwise indicated, all parts and percentages in the following examples, as well as throughout the specification, are by weight.

Example 1

A polycarbonate canopy for an F-22A jet aircraft was lightly abraded to increase its surface roughness and surface area for receiving a primer (3-aminopropyltriethoxy silane, an adhesion promoter). The primer was gravity coated onto the canopy. Next, a polymeric solution (FX-430, produced by PPG Industries, Inc.,) was applied to the canopy by flow coating. The polymeric solution was poured from the top of the canopy and from one end to another, allowing the solution to flow down and coat the canopy by gravity flow. Excess polymeric solution was allowed to flow down into a dripping pan and was collected for proper disposal.

After the entire outer surface of the canopy had been coated, it was cured in a heated oven at about 230° F. for about 5 hours. After the coating was cured, the canopy was abraded to increase its surface area for receiving the next coating layer and then cleaned with isopropanol (IPA). A silane basecoat was then applied by flow coating, followed by a layer of a base coat (FX-419, produced by PPG Industries, Inc.). The coated canopy was then cured in a preheated oven at a temperature of about 190° F. for about 2 hours. After curing, the canopy was thoroughly cleaned to remove dust particles and particulates that may have accumulated on the surface.

The cleaned canopy was then placed in a vacuum chamber. The pressure in the vacuum chamber was reduced and the substrate in the chamber was heated to about 100 to about 200° F. Two metal oxide layers and one metal layer were deposited on the coated canopy at an elevated temperature (e.g., about 100 to about 200° F.) using magnetron sputtering. First, a layer of titanium oxide was formed by sputtering a $TiO_2$ target using a pulsed DC power supply with 300 kHz frequency. A first region of the titanium oxide was formed by simultaneously flowing oxygen and inert gas at a ratio of about 1:2 while sputtering for a time period of about 5-10 minutes. A second region of the titanium oxide was formed by simultaneously flowing oxygen and inert gas at a ratio of 1:29 while sputtering for a time period of about 5-10 minutes. A third region of the titanium oxide was formed by simultaneously flowing oxygen and inert gas at a ratio of about 1:2 while sputtering for a time period of 5-10 minutes. During sputtering, both the canopy and the target moved.

Then, a gold layer was deposited onto the canopy at the same temperature. After the layer of gold was formed, a second layer of titanium oxide was deposited on top of the gold layer at a temperature of about 100 to about 200° F. in a manner similar to that described above with respect to the first layer of titanium oxide. The canopy was then removed from the chamber and cleaned to remove any contaminants that might have adhered to the surface. A topcoat (FX-446, produced by PPG Industries, Inc.) was then applied to the second metal oxide layer (i.e., the second titanium oxide layer) and cured.

Comparative Example 1

A polycarbonate coupon was lightly abraded to increase its surface roughness and surface area for receiving a primer (3-aminopropyltriethoxy silane, an adhesion promoter). The primer was gravity coated onto the coupon. Next, a polymeric solution (FX-430, produced by PPG Industries, Inc.,) was applied to the coupon by flow coating. The polymeric solution was poured from the top of the coupon and from one end to another, allowing the solution to flow down and coat the coupon by gravity flow. Excess polymeric solution was allowed to flow down into a dripping pan and was collected for proper disposal.

After the entire outer surface of the coupon has been coated, it was cured in a heated oven at about 230° F. for about 5 hours. After the coating was cured, the coupon was abraded to increase its surface area for receiving the next coating layer and then cleaned with isopropanol (IPA). A silane basecoat was then applied by flow coating, followed by a layer of a base coat (FX-419, produced by PPG Industries, Inc.). The coated coupon was then cured in a preheated oven at a temperature of about 190° F. for about 2 hours. After curing, the coupon was thoroughly cleaned to remove dust particles and particulates that may have accumulated on the surface.

The cleaned coupon was then placed in a vacuum chamber. The pressure in the vacuum chamber was reduced and the substrate in the chamber was heated to about 100 to about 200° F. Two metal oxide layers and one metal layer were deposited on the coated coupon at an elevated temperature (e.g., about 100 to about 200° F.) using magnetron sputtering. First, a layer of AZO was formed, and then a gold layer was deposited onto the coupon at the same temperature. After a layer of gold was formed, a second layer of AZO was deposited on top of the gold layer at a temperature of about 100 to about 200° F. The coupon was then removed from the chamber and then cleaned to remove any contaminants that might have adhered to the surface.

A topcoat (FX-446, produced by PPG Industries, Inc.) was then applied to the second metal oxide layer (i.e., second AZO layer) and cured. The following test procedures were then performed on the coated transparencies of Example 1 and Comparative Example 1.

Haze and Luminous Transmittance Tests

A 3 inch by 12 inch coupon prepared according to Example 1 and a 3 inch by 12 inch coupon prepared according to Comparative Example 1 were each tested according to ASTM D1003 using a Haze-Gard Plus instrument. Haze measures the clearness and transparency of the film (the film should not be translucent and diffuse light), while luminous or visible light transmittance indicates the amount of visible light transmitted through the sample. The coupon according to Example 1 exhibited a visible light transmittance of 61-67% and a haze of 1.24%, while the coupon according to Comparative Example 1 exhibited a visible light transmittance of 67% and a haze of 2.66%. According to the test results, the coupon according to Example 1 meets the visible light transmittance and haze values required for aircraft canopy, windshield and windows, which are 58% or above and 10% or below, respectively.

Bayer Abrasion Test

The abrasion resistance of a 2 inch by 2 inch coupon prepared according to Example 1 was tested according to ASTM F735 for 300 cycles and 600 cycles. Prior to the Bayer abrasion test, the coupon exhibited a visible light transmittance of 61-67% and a haze of 1.24%, as determined by the above-described haze and luminous transmittance test. After 300 cycles of the Bayer Abrasion test, the coupon exhibited a visible light transmittance of 61-67% and haze of 1.24%, as determined by the above-described haze test. After 600 cycles of the Bayer Abrasion test, the coupon exhibited a visible light transmittance of 61-67% and haze of 1.45%, as determined by the above-described haze test. According to the test results, the visible light transmittance and haze of the coupon were not significantly altered by the Bayer abrasion test.

Humidity Test

A 3 inch by 12 inch coupon prepared according to Example 1, was exposed to 100% condensing humidity at 122° F. (50° C.). The haze and visible light transmittance (VLT) were then measured after 3 weeks, 4 weeks, and then 5 weeks of exposure. The results of the humidity test are shown in Table 1 below, along with remarks regarding the quality of the coupon following the exposure.

Humidity and Solar Radiation (QUV) Test

A 3 inch by 12 inch coupon prepared according to Example 1, was exposed to cycles of 8 hours of ultraviolet (UV) radiation at 158° F. (70° C.) followed by exposure to condensation for 4 hours at 122° F. (50° C.). The haze and visible light transmittance (VLT) were then measured after the cycles had been repeated for a total of 3 weeks, 4 weeks, and then 5 weeks. The results of the QUV test are shown in Table 1 below, along with remarks regarding the quality of the coupon following the exposure.

TABLE 1

| Number of weeks | QUV | | | Humidity | | |
| --- | --- | --- | --- | --- | --- | --- |
| | Haze (%) | VLT (%) | Remarks | Haze (%) | VLT (%) | Remarks |
| 3 | 2.4 | 64.7 | Good | 1.6 | 64.4 | Good |
| 4 | 2.56 | 64.5 | Good | 1.88 | 64.1 | Good |
| 5 | 2.51 | 64.5 | Good | 2.40 | 64.0 | Good |

As can be seen in Table 1 above, the coupon prepared according to Example 1 exhibited good performance after 5 weeks of the QUV test, and the coupon only exhibited some water damage after 5 weeks of the Humidity test. Even after 5 weeks of either test, the coupon exhibited acceptable haze and visible light transmittance, and would be expected to exhibit acceptable haze and visible light transmittance even after 12 weeks of exposure to the QUV test or the Humidity test.

The above Humidity and QUV tests were also performed for different time periods on coupons prepared according to Example 1 and Comparative Example 1, except that the coupons did not include the topcoat, to evaluate the effects of the Humidity and QUV tests directly on the metal oxide layers. The results of these tests, including remarks regarding the quality of the coating, are presented in Table 2 below. As can be seen in Table 2 below, even without the topcoat, the coupon prepared according to Example 1 (i.e., the coupon including a titanium oxide/Au/titanium oxide electrically conductive stack) performed better than the coupon prepared according to Comparative Example 1 (i.e., the coupon including an AZO/Au/AZO stack).

TABLE 2

| | Number of days of exposure | QUV | | | Humidity | | |
| --- | --- | --- | --- | --- | --- | --- | --- |
| | | Haze (%) | VLT (%) | Remarks | Haze (%) | VLT (%) | Remarks |
| Comparative Example 1 | 2 | 2.4 | 66.5 | Good | 2.2 | 66.3 | Good |
| | 6 | 3.8 | 66.4 | Light corrosion | 4.9 | 66.1 | Heavy corrosion |
| | 14 | 9.84 | 65.87 | Heavy corrosion | 5.19 | 65.7 | Heavy corrosion; AZO removed |
| Example 1 | 14 | 1.56 | 61.5 | Good | 1.72 | 61.5 | Good |
| | 21 | 8.05 | 60.7 | Bad | 1.55 | 61.5 | Good |
| | 28 | | | | | 61.2 | Good |
| | 35 | | | | | 61.3 | Good |
| | 39 | | | | | 60.9 | Good |
| | 42 | | | | | 61.3 | Good |

Accelerated Steam Test

A 2 inch by 2 inch coupon prepared according to Example 1, except that the coupon did not include a topcoat, and a 2 inch by 2 inch coupon prepared according to Comparative Example 1, except that the coupon did not include a topcoat, were each placed just above boiling water in an enclosed chamber. This test was carried out to observe the accelerated effect of directly exposing the bare metal oxide layer to steam. The results of the test after 6 hours, 15-16 hours, 21-22 hours, and 33-34 hours, including remarks regarding the quality of the coating, are shown in Table 2 below. The total thickness range for each stack is shown in Table 3.

TABLE 3

| Coating | 6 hours | 15-16 hours | 21-22 hours | VLT and Haze after 33-34 hours | | |
|---|---|---|---|---|---|---|
| AZO/Au/AZO (AZO thickness of 25-40 nm) | Light corrosion | Heavy corrosion | Heavy corrosion | 64.7% | 7.53% | Bad |
| AZO/Au/AZO (AZO thickness of 50-80 nm) | Light corrosion | Heavy corrosion | Heavy corrosion | 67.7% | 7.02% | Bad |
| Titanium oxide/Au/titanium oxide (titanium oxide thickness of 2-5 nm) | Good | Good | Good | 60 | 1.67 | Good |
| Titanium oxide/Au/titanium oxide (titanium oxide thickness of 5-7 nm) | Good | Good | Good | 60.4 | 1.5 | Good |
| Titanium oxide/Au/titanium oxide (titanium oxide thickness of 18-25 nm) | Good | Good | Good | 60.9 | 1.88 | Good |

Rain Erosion Test

A 1 inch by 1 inch coupon prepared according to Example 1 and a 1 inch by 1 inch coupon prepared according to Comparative Example 1 were each exposed to simulated rainfall at a wind speed of 550 miles per hour (mph) at the University of Dayton Research Institute (UDRI). The coupons were inspected for degradation of the coating after 1 minute, 11 minutes and 22 minutes of exposure to the simulated rainfall. The results of the test are shown below in Table 4.

TABLE 4

| | 1 minute | 11 minutes | 22 minutes |
|---|---|---|---|
| Comparative Example 1 | 100% | 97% | 93% |
| Example 1 | 100% | 100% | 100% |

50/50 Test

A coupon was prepared according to Example 1. An area of the coupon of about 3 inches by 2.5 inches was marked off with tacky tape. A mixture of 50 percent isopropanol and 50 percent water was applied to the surface of the coupon. The coupon was then left in a semi-open container to evaporate overnight. After about 12-14 hours, the coupon was inspected for fisheye, delamination, or distortion of the surface. No changes to the coupon were observed. Additionally, the light transmittance and haze of the coupon was measured before and after the 50/50 test, and no change in the light transmittance or haze was observed.

Acid Test

A coupon was prepared according to Example 1 and a coupon was prepared according to Comparative Example 1, except that neither coupon included a topcoat. Both coupons were tested for acid resistance. A solution was prepared by mixing 5 g of 96.3% sulfuric acid and 5 g of 65% nitric acid (the remaining 35% being water) to provide a solution having a Normality of 2.25 and a pH of 0. Several drops of the solution were placed on the bare metal oxide surface of each coupon (i.e., titanium oxide of Example 1, and AZO of Comparative Example 1) to form a drop having a diameter of about 1 cm. A watch glass was then placed over the drop and the coupon and watch glass were sealed with tacky tape to prevent evaporation. After 15 minutes the tacky tape and watch glass were removed and the metal oxide layer was examined. The AZO layer of the coupon prepared according to Comparative Example 1 was completely removed. The titanium oxide layer of the coupon prepared according to Example 1 exhibited virtually no change after exposure to the acid. As such, titanium oxide exhibited substantially higher acid resistance than AZO.

Comparative Example 2

ITO/Au/ITO

A first ITO layer was prepared using a pulsed DC magnetron sputtering system in an Ar and $O_2$ gas mixture at a temperature of about 100 to about 200° F. An ITO ceramic target including about 90 at. % $In_2O_3$ and 10 at. % $Sn_2O_4$ was used. A gold layer was deposited on the first ITO layer using a DC magnetron sputtering system at a temperature of about 100 to about 200° F. using an Ar gas atmosphere. A second ITO layer was formed over the gold layer using a pulsed DC magnetron sputtering system in an Ar and $O_2$ gas mixture at a temperature of about 100 to about 200° F.

Comparative Example 3

ITO/Ag/ITO

A first ITO layer was prepared using a pulsed DC magnetron sputtering system in an Ar and $O_2$ gas mixture at a temperature of about 100 to about 200° F. An ITO ceramic target including about 90 at. % $In_2O_3$ and 10 at. % $Sn_2O_4$ was used. A silver layer was deposited on the first ITO layer using a DC magnetron sputtering system at room temperature using an Ar gas atmosphere. A second ITO layer was formed over the silver layer using a pulsed DC magnetron sputtering system in an Ar and $O_2$ gas mixture at room temperature.

Figure 8:
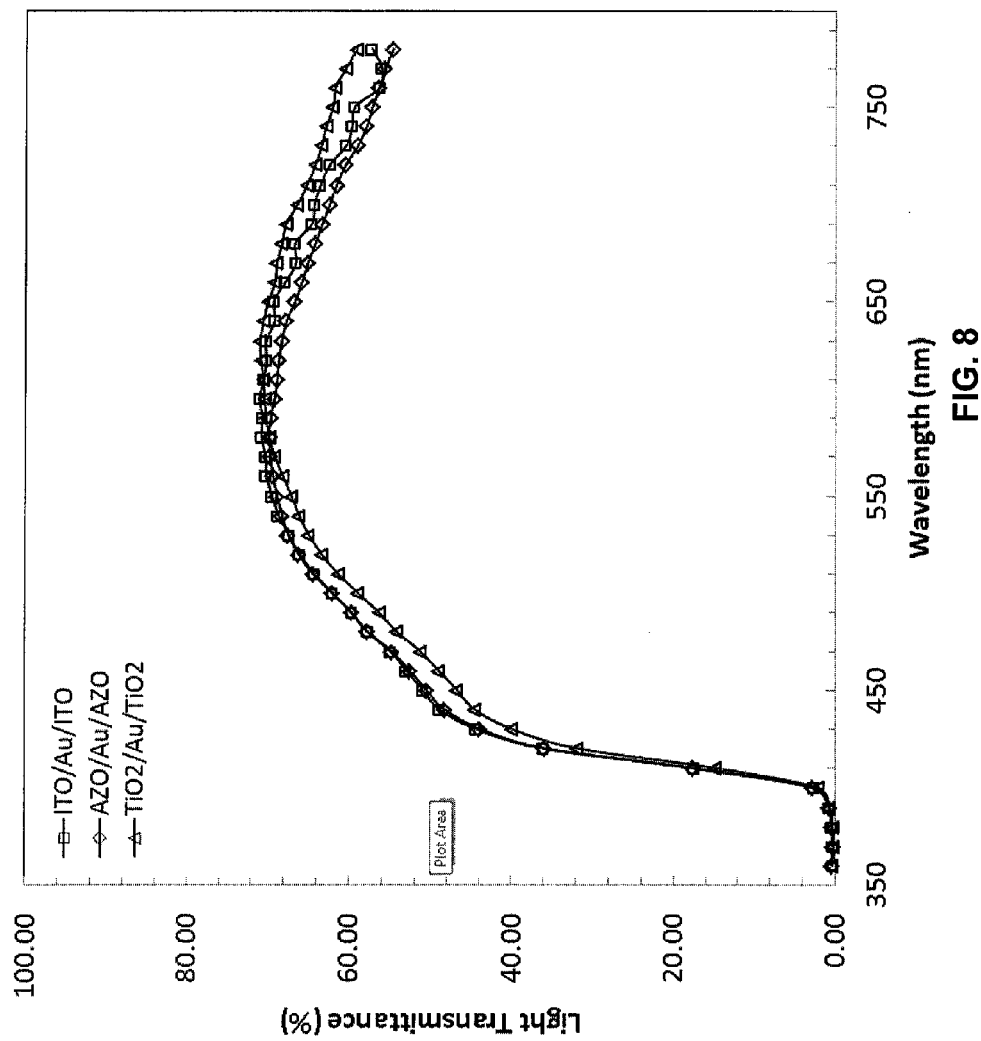
FIG. 8 is a graph comparing the light transmittance versus wavelength of light of a multilayer stack including a titanium oxide/Au/titanium oxide stack according to an embodiment of the present invention to a multilayer stack including AZO/Au/AZO and a multilayer stack including ITO/Au/ITO.

FIG. 8 is a graph showing light transmittance versus wavelength of light of a multilayer titanium oxide/Au/titanium oxide stack according to an embodiment of the present invention as compared to an AZO/Au/AZO stack according to Comparative Example 1 and an ITO/Au/ITO stack according to Comparative Example 2. The results are also shown below in Table 6.

TABLE 5

| Sample | Light transmittance (%) |
|---|---|
| Titanium oxide/Au/titanium oxide | 65.49 |
| AZO/Au/AZO | 66.70 |
| ITO/Au/ITO | 67.31 |

Four Point Bend Test

Figure 9:
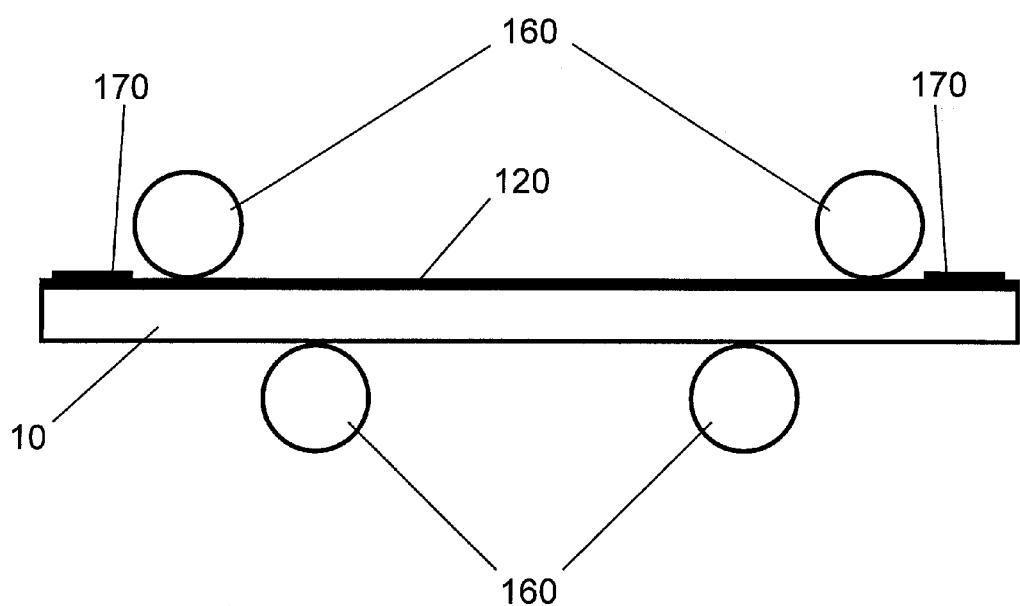
FIG. 9 is a schematic side view of the arrangement used in the Four Point Bend Test.
Figure 10:
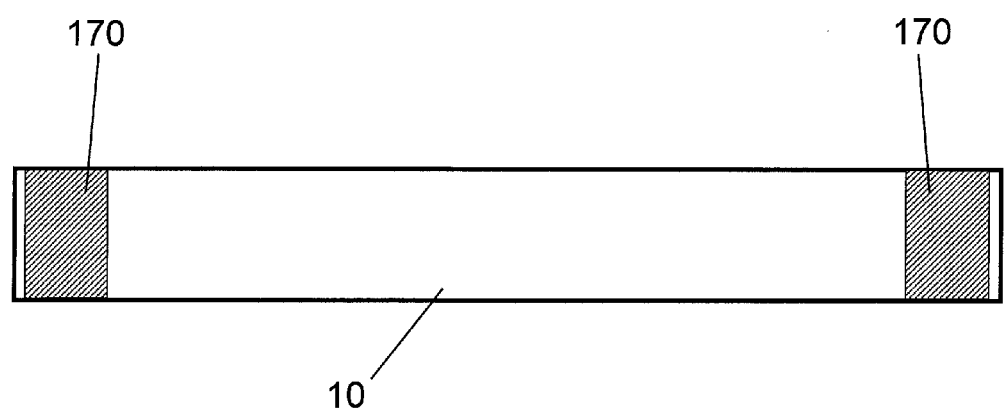
FIG. 10 is a schematic top view of a portion of the arrangement used in the Four Point Bend Test.

Coatings including multilayer stacks prepared according to Example 1, Comparative Example 1, Comparative Example 2, and Comparative Example 3 were subjected to the four point bend test to measure the change in electrical resistance ($\Delta R/R$) of each multilayer stack as a function of the uniaxial tensile elongation of the multilayer stack. For example, a coupon according to Example 1 was prepared for the four point bend test as follows. A first basecoat was applied on a substrate 10 (i.e., a transparency) 2 inches wide, 12 inches in length, and 0.75 inches thick. Then, an electrically conductive multilayer stack 120 including titanium oxide/Au/titanium oxide was deposited on the substrate 10 in a vacuum chamber. A conductive tape (one inch wide) was then vertically applied over the electrically conductive multilayer stack to provide application sites for the bus-bars 170, as shown in FIGS. 9 and 10. The remaining portion of the electrically conductive multilayer stack (8.5 inches in length) was coated with a primer and a topcoat. No organic coating was applied over the conductive tape. Two flexible metallic conductive bus-bars 170 were applied over the conductive tape as shown in FIGS. 9 and 10, and the bus-bus resistance of the coupon was recorded.

Next, a strain gage resistor (not shown) obtained from Vishay Precision Group, Inc. was mounted on the center section of the substrate, on the side opposite to the bus-bars. The strain gage was used to determine the tensile elongation (flexibility) of the coating layers. A tensile load was applied to the substrate using a united tensile testing system. Four bending bars 160, shown in FIG. 9, applied the tensile load. The bending bars 160 on the side opposite to the bus-bars were spaced about 4 inches apart. The electrical bus-bus resistance was monitored throughout the test. If the resistance of the substrate exceeded 20% above the original value, the tensile strain of the coupon was recorded. The four point bend test was then repeated, as described-above, for coupons prepared according to Comparative Example 1 (i.e., a coupon including an AZO/Au/AZO stack), Comparative Example 2 (i.e., a coupon including an ITO/Au/ITO stack), and Comparative Example 3 (i.e., a coupon including an ITO/Ag/ITO stack).

Figure 11:
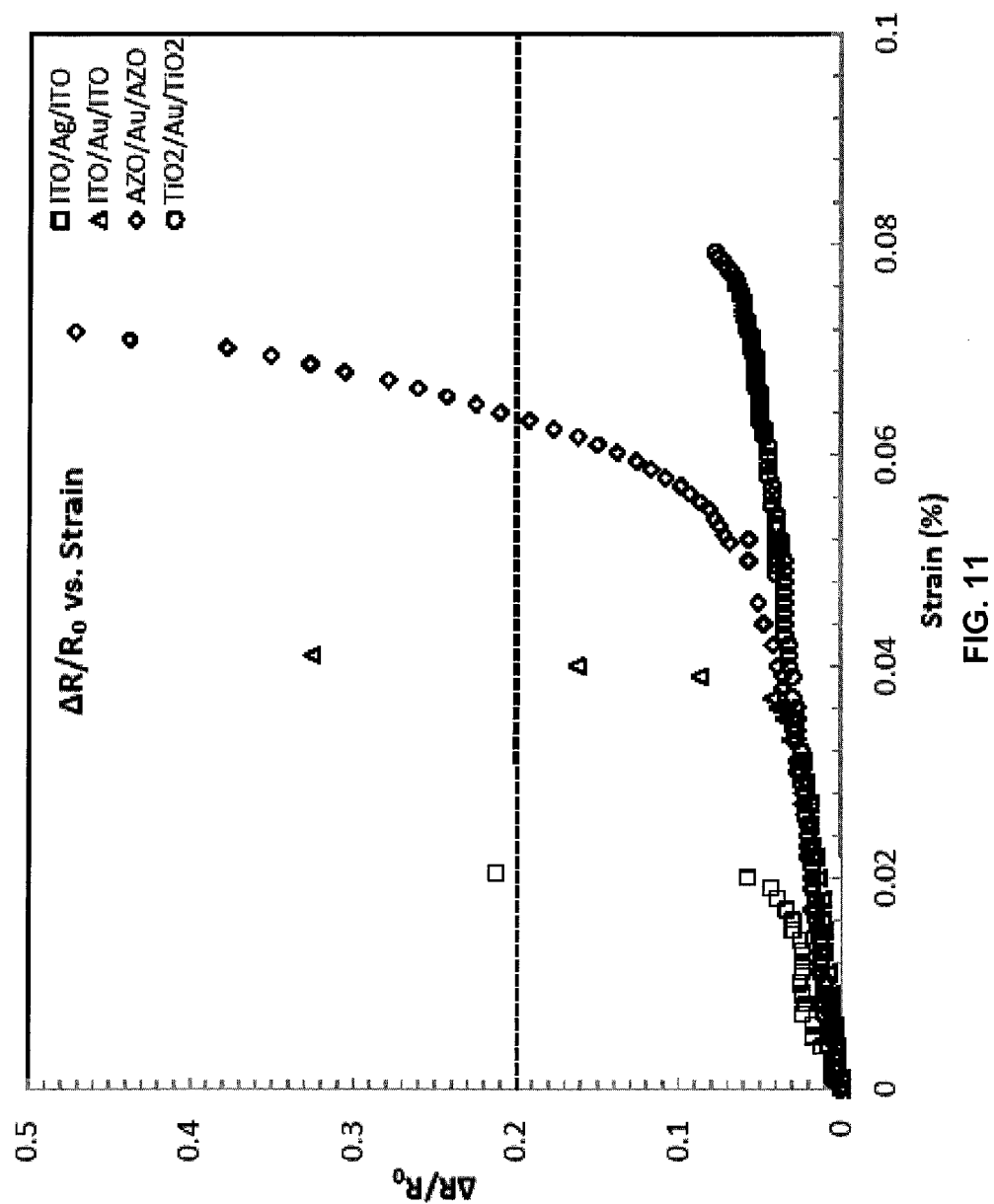
FIG. 11 is a graph comparing the results of the Four Point Bend Test for a multilayer stack including a titanium oxide/Au/titanium oxide stack according to an embodiment of the present invention to a multilayer stack including AZO/Au/AZO, a multilayer stack including ITO/Au/ITO and a multilayer stack including ITO/Ag/ITO.

Some of the results of the above-described four point bend test are shown in FIG. 11, which is a graph of the change in electrical resistance ($\Delta R/R$) versus strain of the multilayer stack prepared according to Example 1 (titanium oxide/Au/titanium oxide). A summary of the results of the four point bend test is also shown below in Table 7.

TABLE 6

| Sample | Four Point Bend Test Results: Uniaxial Tensile Elongation (%) |
|---|---|
| Example 1 (2" × 12" coupon) | Greater than 7.9% |
| Comparative Example 1 (2" × 12" coupon) | about 6.4% |
| Comparative Example 2 (2" × 12" coupon) | about 4% |
| Comparative Example 3 (2" × 12" coupon) | about 2% |

As can be seen in FIG. 11 and Table 7, Example 1 performed better in the four point bend test than Comparative Example 1, and substantially better than either Comparative Example 2 or Comparative Example 3. Specifically, according to the above-described four point bend test, Example 1, which includes a titanium oxide/Au/titanium oxide multilayer stack according to an exemplary embodiment of the present invention, exhibited a greater than 50% increase in uniaxial tensile elongation over Comparative Example 2, which includes an ITO/Au/ITO multilayer stack. Here, the flexibility of Example 1 exceeded the capabilities of the equipment used for the test. Due to the limitations of the equipment used for the four point bend test, the maximum uniaxial tensile elongation that could be measured for Example 1 was 7.9%. However, as can be seen in FIG. 11, the coupon prepared according to Example 1 would be expected to exhibit a uniaxial tensile elongation greater than 7.9%, if measured using equipment having increased capabilities. In contrast, Comparative Example 2 exhibited a maximum of about 4% uniaxial tensile elongation. Additionally, according to the above-described four point bend test, Example 1 exhibited a greater than 200% increase in uniaxial tensile elongation over Comparative Example 3, which includes an ITO/Ag/ITO multilayer stack. That is, as described above, Example 1 would be expected to exhibit a maximum uniaxial tensile elongation of greater than 7.9%, while Comparative Example 3 exhibited about 2% maximum uniaxial tensile elongation. The relatively lower flexibility of the ITO/Ag/ITO stack of Comparative Example 3 is due, in part, to the Ag layer, a portion of which oxidizes to silver oxide, which is relatively brittle. However, even when the Ag layer is replaced with a Au layer, a coating including the corresponding electrically conductive multilayer stack of Comparative Example 2, only exhibits a strain elongation of about 4%. Accordingly, a coating including an electrically conductive multilayer stack according to an exemplary embodiment of the present invention performed substantially better in the above-described four point bend test than Comparative Examples 2 and 3.

TEM Analysis

A titanium oxide/Au/titanium oxide electrically conductive multilayer stack prepared according to Example 1 was analyzed using a transmission electron microscope (TEM). The thickness of the layer was determined by TEM analysis to be about 11-12 nm. Additionally, to investigate the affect of oxygen concentration on the thickness of the titanium oxide layers, two titanium oxide layers were formed directly on silicon substrates, each layer having a uniform oxygen concentration, and analyzed using TEM. The only difference in the formation of these two titanium oxide layers was the flow rate of oxygen during the formation of the titanium oxide layers by sputtering from a $TiO_2$ target. The change in oxygen flow rate was compensated for by a corresponding change in the flow rate of the inert gas. As could be seen by TEM, the thickness of the titanium oxide layer could be reduced by as much as one half by reducing the flow rate of oxygen. In particular, the high oxygen content titanium oxide layer had a thickness of about one half the thickness of the low oxygen content titanium oxide layer. Thus, if all other conditions are kept the same (e.g., sputtering time, power applied, target size, etc.) varying the oxygen flow rate while forming the titanium oxide layer will result in a variation in the thickness of the resultant titanium oxide layer.

Light Transmittance and Adhesion vs. Oxygen Flow Rate

Using the above-described light transmittance test, the light transmittance was studied for various titanium oxide layers formed using several different oxygen flow rates while sputtering. Additionally, those same samples were tested for cross-hatch adhesion according to ASTM D3359. The results of the light transmittance and cross-hatch adhesion tests are shown below in Table 7.

TABLE 7

| Gas Flow Rate Ar/$O_2$ (sccm) | Light Transmittance (%) | Adhesion |
| --- | --- | --- |
| 200/100 | 50 | 100 |
| 260/40 | 58 | 0 |
| 270/30 | 61 | 0 |
| 280/20 | 63 | 0 |
| 290/10 | 68 | 0 |

Although various embodiments of the invention have been described, additional modifications and variations will be apparent to those skilled in the art. For example, the coated transparency can have additional tie layers or primers, conductive tie layers, alternate thicknesses, additional components, etc. Also, as the individual layers that include the coated transparency are formed, they can be cleaned before the next adjacent layer is deposited. For example, the canopy can be cleaned with a solvent such as acetone, and then dried to remove any surface water, which could cause premature crosslinking of the polysiloxane of the base layer 30. The invention is not limited to the embodiments specifically disclosed, and the coated transparency, its layers, and compositions may be modified without departing from the invention, which is limited only by the appended claims and equivalents thereof.

Throughout the text and claims, use of the word "about" reflects the penumbra of variation associated with measurement, significant figures, and interchangeability, all as understood by a person having ordinary skill in the art to which this invention pertains.

What is claimed is:

1. An electrically conductive multilayer stack comprising:
   first and second metal oxide layers comprising a titanium oxide, the first metal oxide layer comprising a first region comprising a titanium oxide, a second region on the first region and comprising a titanium oxide, and a third region on the second region and comprising a titanium oxide, the first region and the third region each having a higher oxygen concentration than that of the second region, wherein:
   the first region has a thickness in a range of about 0.5 to about 6 nm, and/or
   the second region has a thickness in a range of about 3 to about 8 nm, and/or
   the third region has a thickness in a range of about 0.5 to about 6 nm; and
   a metal layer between the first and second metal oxide layers.

2. The electrically conductive multilayer stack of claim 1, wherein the metal layer comprises gold.

3. The electrically conductive multilayer stack of claim 1, wherein the second metal oxide layer comprises a first region, a second region on the first region, and a third region on the second region, the first region and the third region each having a higher oxygen concentration than that of the second region.

4. The electrically conductive multilayer stack of claim 1, wherein the first region has a thickness in a range of about 0.5 to about 6 nm.

5. The electrically conductive multilayer stack of claim 1, wherein the second region has a thickness in a range of about 3 to about 8 nm.

6. The electrically conductive multilayer stack of claim 1, wherein the third region has a thickness in a range of about 0.5 to about 6 nm.

7. The electrically conductive multilayer stack of claim 1, wherein a ratio of a thickness of the first region to a thickness of the second region is in a range of about 0.0625:1 to about 1:1.

8. The electrically conductive multilayer stack of claim 1, wherein a ratio of a thickness of the third region to a thickness of the second region is in a range of 0.0625:1 to 1:1.

9. The electrically conductive multilayer stack of claim 1, wherein at least one of the first metal oxide layer and the second metal oxide layer has a total thickness in a range of about 4 to about 15 nm.

10. The electrically conductive multilayer stack of claim 1, wherein the metal layer has a thickness in a range of about 5 to about 20 nm.

11. An electrically conductive coated transparency comprising a transparency and the electrically conductive multilayer stack of claim 1 on the transparency.

12. The electrically conductive coated transparency of claim 11, further comprising a topcoat on the electrically conductive multilayer stack, the topcoat comprising a hydrophobic component having a fluorinated carbon backbone and a hydrophilic component having a polyether chain.

13. The electrically conductive coated transparency of claim 11, further comprising a topcoat on the electrically conductive multilayer stack, the topcoat comprising the reaction product of a hydrophobic precursor having a fluorinated carbon backbone and a hydrophilic precursor having a polyether chain.

14. A method of manufacturing an electrically conductive multilayer stack, the method comprising:
   forming a first metal oxide layer comprising a titanium oxide;
   forming a metal layer on the first metal oxide layer; and
   forming a second metal oxide layer comprising a titanium oxide on the metal layer, at least one of the forming the first metal oxide layer or the forming the second metal oxide layer comprising varying a flow rate of oxygen to form a first region comprising a titanium oxide, a second region on the first region and comprising a titanium oxide, and a third region on the second region and comprising a titanium oxide, the first region and the third region each having a higher oxygen concentration than that of the second region, wherein:
   the first region has a thickness in a range of about 0.5 to about 6 nm, and/or
   the second region has a thickness in a range of about 3 to about 8 nm, and/or
   the third region has a thickness in a range of about 0.5 to about 6 nm.

15. The method of claim 14, wherein the varying the flow rate of oxygen comprises flowing oxygen at a first oxygen flow rate, then flowing oxygen at a second oxygen flow rate, and then flowing oxygen at a third oxygen flow rate.

16. The method of claim 15, wherein a ratio of the first oxygen flow rate to the second oxygen flow rate is in a range of 10:1 to 25:1 and a ratio of the third oxygen flow rate to the second oxygen flow rate is in a range of 10:1 to 25:1.

17. The method of claim 15, wherein the varying the flow rate of oxygen further comprises flowing a first inert gas at a first inert gas flow rate, then flowing a second inert gas at a second inert gas flow rate, and then flowing a third inert gas at a third inert gas flow rate.

18. The method of claim 14, wherein the forming the first metal oxide layer and the forming the second metal oxide layer each comprise varying the flow rate of oxygen during formation.

19. A method of manufacturing an electrically conductive multilayer stack, the method comprising:
forming a first metal oxide layer comprising titanium oxide;
forming a metal layer on the first metal oxide layer; and
forming a second metal oxide layer comprising titanium oxide on the metal layer, at least one of the forming the first metal oxide layer and the forming the second metal oxide layer comprising forming a first region comprising a titanium oxide, a second region comprising a titanium oxide and a third region comprising a titanium oxide, the first region and third region each having a higher oxygen concentration than the second region, wherein:
the first region has a thickness in a range of about 0.5 to about 6 nm, and/or
the second region has a thickness in a range of about 3 to about 8 nm, and/or
the third region has a thickness in a range of about 0.5 to about 6 nm.

20. The method of claim 19, wherein the forming the first metal oxide layer comprises sputtering, evaporation, atomic layer deposition, or chemical vapor deposition.

21. An electrically conductive multilayer stack comprising:
first and second metal oxide layers comprising a titanium oxide, the first metal oxide layer comprising a first region having a thickness in a range of about 0.5 to about 6 nm, a second region on the first region, and a third region on the second region, the first region and the third region each having a higher oxygen concentration than that of the second region; and
a metal layer between the first and second metal oxide layers.

22. An electrically conductive multilayer stack comprising:
first and second metal oxide layers comprising a titanium oxide, the first metal oxide layer comprising a first region, a second region on the first region and having a thickness in a range of about 3 to about 8 nm, and a third region on the second region, the first region and the third region each having a higher oxygen concentration than that of the second region; and
a metal layer between the first and second metal oxide layers.

23. An electrically conductive multilayer stack comprising:
first and second metal oxide layers comprising a titanium oxide, the first metal oxide layer comprising a first region, a second region on the first region, and a third region on the second region and having a thickness in a range of about 0.5 to about 6 nm, the first region and the third region each having a higher oxygen concentration than that of the second region; and
a metal layer between the first and second metal oxide layers.

* * * * *